US011182032B2

(12) United States Patent
Kwon et al.

(10) Patent No.: US 11,182,032 B2
(45) Date of Patent: Nov. 23, 2021

(54) TOUCH SENSOR MODULE, WINDOW STACK STRUCTURE INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Hye Rim Kwon, Incheon (KR); Sung Woo Yu, Gyeonggi-do (KR); Dong Jin Son, Chungcheongnam-do (KR); Jin Woo Lee, Seoul (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 0 days.

(21) Appl. No.: 17/113,226

(22) Filed: Dec. 7, 2020

(65) Prior Publication Data

US 2021/0089166 A1    Mar. 25, 2021

Related U.S. Application Data

(63) Continuation of application No. PCT/KR2019/005902, filed on May 17, 2019.

(30) Foreign Application Priority Data

Jun. 8, 2018  (KR) .................. 10-2018-0066103
Sep. 20, 2018 (KR) .................. 10-2018-0113003
Sep. 20, 2018 (KR) .................. 10-2018-0113004

(51) Int. Cl.
*G06F 3/044* (2006.01)
*G06F 3/041* (2006.01)
(Continued)

(52) U.S. Cl.
CPC ........ *G06F 3/0443* (2019.05); *G06F 3/04164* (2019.05); *G02F 1/13338* (2013.01);
(Continued)

(58) Field of Classification Search
CPC .. G06F 3/0443; G06F 3/04164; G06F 3/0446; G06F 1/13338; G06F 2203/04102;
(Continued)

(56) References Cited

U.S. PATENT DOCUMENTS

2006/0036059 A1* 2/2006 Takamoto ............ C08G 63/185
                                                528/272
2016/0147361 A1* 5/2016 Ahn ........................ G09G 3/20
                                                345/173
2017/0192586 A1* 7/2017 Lin ..................... G06F 3/0412

FOREIGN PATENT DOCUMENTS

KR   10-2008-0091900 A   10/2008
KR   10-2014-0131130 A   11/2014
(Continued)

OTHER PUBLICATIONS

International Search Report for PCT/KR2019/005902 dated Aug. 23, 2019.

*Primary Examiner* — Mark Edwards
(74) *Attorney, Agent, or Firm* — The PL Law Group, PLLC

(57) ABSTRACT

A touch sensor module according to an embodiment of the present invention includes a touch sensor layer including sensing electrodes and traces branching from the sensing electrodes, a flexible circuit board electrically connected to the traces at one end portion of the touch sensor layer, and a supporting structure commonly and partially covering the flexible circuit board and the touch sensor layer. Damages and delamination of electrodes and wirings included in the flexible circuit board and the touch sensor layer is prevented by the supporting structure.

20 Claims, 6 Drawing Sheets

(51) Int. Cl.
 *G02F 1/1333* (2006.01)
 *H01L 27/32* (2006.01)
(52) U.S. Cl.
 CPC .. *G06F 3/0446* (2019.05); *G06F 2203/04102* (2013.01); *G06F 2203/04103* (2013.01); *G06F 2203/04111* (2013.01); *H01L 27/323* (2013.01)
(58) Field of Classification Search
 CPC . G06F 2203/04103; G06F 2203/04111; G06F 27/323
 USPC ......................................................... 345/174
 See application file for complete search history.

(56) References Cited

FOREIGN PATENT DOCUMENTS

| KR | 10-2015-0125108 A | 11/2015 |
|----|-------------------|---------|
| WO | WO 2013/063176 A1 | 5/2013 |
| WO | WO 2015/002394 A1 | 1/2015 |
| WO | 2017/111540 A1 | 6/2017 |

\* cited by examiner

TOUCH SENSOR MODULE, WINDOW STACK STRUCTURE INCLUDING THE SAME AND IMAGE DISPLAY DEVICE INCLUDING THE SAME

CROSS REFERENCE TO RELATED APPLICATIONS AND CLAIM OF PRIORITY

The present application is a continuation application to International Application No. PCT/KR2019/005902 with an International Filing Date of May 17, 2019, which claims the benefit of Korean Patent Applications Nos. 10-2018-0066103 filed on Jun. 8, 2018, 10-2018-0113003 filed on Sep. 20, 2018 and 10-2018-0113004 filed on Sep. 20, 2018 at the Korean Intellectual Property Office, the disclosures of which are incorporated by reference herein in their entirety.

BACKGROUND

1. Field

The present invention relates to a touch sensor module, a window stack structure including the same and an image display device including the same. More particularly, the present invention related to a touch sensor module including a sensing electrode and an insulation structure, a window stack structure including the same and an image display device including the same

2. Description of the Related Art

As information technologies are being developed, various demands in display devices having thinner dimension, lightweight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device.

As a flexible display capable of being bent or folded is being developed, the touch sensor having proper properties, structures and constructions for being applied to the flexible display is also needed. Additionally, a proper locational and structural design of the touch sensor may be required in consideration of a connection reliability with a main board, a circuit board, etc., in the image display device.

For example, a touch sensor or a touch screen panel combined with various image display devices are being developed as disclosed in Korean Patent Published Publication No. 2014-0092366.

SUMMARY

According to an aspect of the present invention, there is provided a touch sensor module having improved electrical and mechanical reliability.

According to an aspect of the present invention, there is provided a window stack structure including a touch sensor module having improved electrical and mechanical reliability.

According to an aspect of the present invention, there is provided an image display device including a touch sensor module having improved electrical and mechanical reliability.

(1) A touch sensor module, including: a touch sensor layer including sensing electrodes and traces branching from the sensing electrodes; a flexible circuit board electrically connected to the traces at one end portion of the touch sensor layer; and a supporting structure commonly and partially covering the flexible circuit board and the touch sensor layer.

(2) The touch sensor module according to the above (1), wherein the touch sensor layer includes a display area in which the sensing electrodes are arranged, a trace area in which the traces are disposed, and a connection area in which terminal ends of the traces are disposed.

(3) The touch sensor module according to the above (2), wherein the flexible circuit board is electrically connected to the terminal ends of the traces in the connection area, and the supporting structure covers the connection area and the trace area in a planar view.

(4) The touch sensor module according to the above (3), wherein the touch sensor layer further includes a margin area in which some of the sensing electrodes are arranged between the display area and the trace area.

(5) The touch sensor module according to the above (4), wherein the supporting structure covers the margin area in the planar view.

(6) The touch sensor module according to the above (5), wherein the margin area serves as a bending area.

(7) The touch sensor module according to the above (1), wherein the supporting structure includes a substrate layer; and a supporting layer formed on the substrate layer, wherein the supporting layer includes an adhesive material.

(8) The touch sensor module according to the above (1), wherein a tensile modulus of the supporting structure is in a range from 1,500 to 5,000 MPa.

(9) The touch sensor module according to the above (8), wherein an adhesion force of the supporting structure to the touch sensor layer is greater than an adhesion force of the supporting structure to the flexible circuit board.

(10) The touch sensor module according to the above (9), wherein the adhesion force of the supporting structure to the touch sensor layer is 2 N/12 mm or more, and the adhesion force of the supporting structure to the flexible circuit board is 0.5 N/0.5 mm or more.

(11) The touch sensor module according to the above (1), further including an optical layer disposed on a central portion of the touch sensor layer and spaced apart from the supporting structure in a horizontal direction to form a gap; and a filling layer at least partially filling the gap.

(12) The touch sensor module according to the above (11), wherein the filling layer has a top surface lower than top surfaces of the optical layer and the supporting structure.

(13) The touch sensor module according to the above (11), wherein the filling layer partially covers a top surface of the supporting structure, and the filling layer has a top surface lower than that of the optical layer.

(14) The touch sensor module according to the above (11), wherein a viscosity of the filling layer is in a range from 1,000 to 5,000 cP at room temperature.

(15) The touch sensor module according to the above (11), wherein a tensile modulus of the filling layer is in a range from 5 to 3,500 MPa.

(16) The touch sensor module according to the above (11), wherein an adhesion force of the filling layer to a surface of the touch sensor layer is 2 N/25 mm or more.

(17) The touch sensor module according to the above (11), wherein the optical layer includes at least one of a polarizer, a polarizing plate, a retardation film, a reflective sheet, a brightness enhancing film or a refractive index matching film.

(18) The touch sensor module according to the above (11), wherein the filling layer includes an adhesive resin.

(19) A window stack structure, comprising: a window substrate; and the touch sensor module according to exemplary embodiments as described above stacked on a surface of the window substrate.

(20) An image display device, comprising: a display panel; and a touch sensor module according to exemplary embodiments as described above stacked on the display panel.

A touch sensor module according to embodiments of the present invention may include a supporting structure partially covering a touch sensor layer and a flexible printed circuit board. When the touch sensor module is folded or bent, delamination of the flexible printed circuit board may be prevented by the supporting structure and damages to sensing electrodes or traces in a bending area may be also prevented.

In some embodiments, the touch sensor module may further include an optical film disposed on the touch sensor layer. A gap may be formed between the supporting structure and the optical film, and a filling layer may be formed to fill the gap. A bonding strength or an adhesion of the supporting structure may be further improved by the filling layer, and damages to the sensing electrodes or traces may be additionally suppressed when a protective film under the touch sensor layer is peeled off.

The touch sensor module may be fabricated as a substrate-less type thin film and may be effectively applied to an image display device such as a flexible display.

DETAILED DESCRIPTION OF THE EMBODIMENTS

According to exemplary embodiments of the present invention, there is provided a touch sensor module including a touch sensor layer, an optical layer disposed on a display region of the touch sensor layer, a flexible circuit board disposed on a peripheral region of the touch sensor layer, and a supporting structure partially covering the touch sensor layer and the flexible circuit board According to exemplary embodiments of the present invention, an image display device including the touch sensor module is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

In the accompanying drawings, for example, two directions being parallel to a top surface of a touch sensor layer or a protective film and perpendicular to each other are defined as a first direction and a second direction. For example, the first direction may correspond to a length direction of the touch sensor module, and the second direction may correspond to a width direction of the touch sensor module. Additionally, a direction vertical to the first and second directions may be defined as a third direction. For example, the third direction may correspond to a thickness direction of the touch sensor module.

Figure 1:
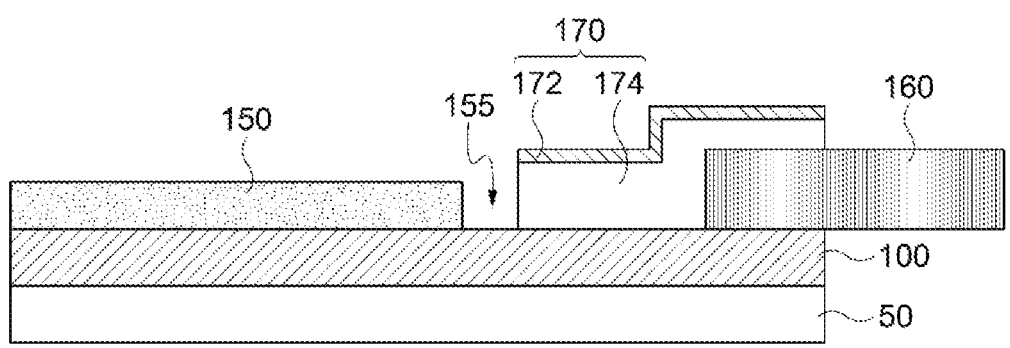
FIG. 1 is a schematic cross-sectional view illustrating a touch sensor module in accordance with exemplary embodiments.

FIG. 1 is a schematic cross-sectional view illustrating a touch sensor module in accordance with exemplary embodiments.

Referring to FIG. 1, the touch sensor module may include a touch sensor layer 100, a flexible circuit board 160 connected to an end portion of the touch sensor layer 100, and a supporting structure 170 partially covering the flexible circuit board 160 and the touch sensor layer 100 together.

In some embodiments, the touch sensor layer 100 may be disposed on a protective film 50. The protective film 50 may include, e.g., an inorganic insulating film and/or an organic insulating film. For example, a polymer film including cyclic olefin polymer (COP), polyethylene terephthalate (PET), polyacrylate (PAR), polyetherimide (PEI), polyethylene naphthalate (PEN), polyphenylene sulfide (PPS), polyallylate, polyimide (PI), cellulose acetate propionate (CAP), polyethersulfone (PES), cellulose triacetate (TAC), polycarbonate (PC), cyclic olefin copolymer (COC), polymethylmethacrylate (PMMA), or the like may be used as the protective film 50.

In an embodiment, the protective film 50 may be formed to protect sensing electrodes and traces during a fabrication of the touch sensor layer 100, and may be removed after forming the touch sensor module.

The touch sensor layer 100 may include conductive patterns such as the sensing electrode and the traces, and may further include an insulating layer for mutually insulating the conductive patterns. Elements and structures of the touch sensor layer 100 will be described later in more detail with reference to FIGS. 4 and 5.

A flexible printed circuit board (FPCB) 160 may be disposed on an end portion of the touch sensor layer 100 and may be electrically connected to the traces included in the touch sensor layer 100. In an embodiment, a terminal portion or a pad portion formed at an end of the trace and a circuit wiring included in the flexible circuit board 160 may be electrically connected to each other via a conductive intermediate structure such as an anisotropic conductive film (ACF).

The flexible circuit board 160 may include, e.g., a core layer including a resin or a liquid crystal polymer, and the circuit wiring printed on the core layer. A coverlay layer covering the circuit wiring may be further formed on the core layer. A portion of the coverlay layer may be removed to expose a portion of the circuit wiring that may be connected to the terminal portion or the pad portion of the touch sensor layer 100.

The touch sensor layer 100 may further include a passivation layer that may protect the sensing electrode and the traces. In this case, a portion of the passivation layer formed on a connection area connected to the flexible circuit board 160 may be removed.

The supporting structure 170 may be formed on portions of the flexible circuit board 160 and the touch sensor layer 100 disposed on the connection area. Accordingly, the supporting structure 170 may commonly and partially cover end portions of the touch sensor layer 100 and the flexible circuit board 160.

The supporting structure 170 may serve as a protective pattern to prevent damages such as delamination, cracks, etc., of the sensing electrodes and the traces caused when the flexible circuit board 160 is detached, folded or bent by an external stress in the connection area. Further, the flexible circuit board 160 and/or the touch sensor layer 100 may be held by the supporting structure 170 when the protective film 50 is removed as described above so that mechanical damages may be reduced or prevented.

The supporting structure 170 may have a multi-layered structure. For example, the supporting structure 170 may include a substrate layer 172 and a supporting layer 174 formed on a surface of the substrate layer 172. The supporting layer 174 may include, e.g., an acrylic, silicone, urethane, and/or rubber-based adhesive material, and may hold the end portions of the flexible circuit board 160 and the touch sensor layer 100 commonly in the connection area.

The substrate layer 172 may include, e.g., a polymer material as described above in the protective film 50.

The touch sensor module may further include the optical layer 150. The optical layer 150 may include a film or a layer structure widely known in the related art for improving an image visibility of an image display device. Non-limiting examples of the optical layer 150 may include a polarizing plate, a polarizer, a retardation film, a reflective sheet, a luminance enhancing film, a refractive index matching film, etc. These may be used alone or in a multi-layered structure including at least two thereof.

In exemplary embodiments, the optical layer 150 may be located at substantially the same layer or the same level as that of the supporting structure 170. In some embodiments, the optical layer 150 and the supporting structure 170 may be horizontally spaced apart by a predetermined distance. Accordingly, a gap 155 may be formed between the optical layer 150 and the supporting structure 170.

The gap 155 may serve as a margin area in consideration of folding or bending of the touch sensor module. Further, the gap 155 may serve as a margin area for alignment of the supporting structure 170.

Process convenience, flexible property and protection of conductive structures such as the sensing electrodes of the image display device may be properly implemented using the gap 155.

In some embodiments, an adhesive layer for bonding the optical layer 150 may be further formed on a top surface of the touch sensor layer 100. In some embodiments, the adhesive layer may be formed between the protective film 50 and the touch sensor layer 100.

In exemplary embodiments, a tensile modulus of the supporting structure 170 may be in a range from about 1,500 to 5,000 MPa.

If the tensile modulus of the supporting structure 170 is less than about 1,500 MPa, breakage of the supporting structure 170 or delamination of the flexible circuit board 160 may occur during folding or bending. If the tensile modulus of the supporting structure 170 exceeds about 5,000 MPa, a hardness of the supporting structure 170 may be excessively increased and sufficient flexibility may not be achieved. In a preferable embodiment, the tensile modulus of the supporting structure 170 may be adjusted in a range from about 1,500 to 4,000 MPa.

An adhesion force of the supporting structure 170 may be different on the touch sensor layer 100 and the flexible circuit board 160. In exemplary embodiments, an adhesion force of the supporting structure 170 on the touch sensor layer 100 may be greater than an adhesion force of the supporting structure 170 on the flexible circuit board 160. Accordingly, the supporting structure 170 may be stably combined with the touch sensor layer 100 to fix the flexible circuit board 160. Thus, delamination or detachment of the flexible circuit board 160 during folding or bending may be more effectively prevented.

In some embodiments, the adhesion force of the supporting structure 170 on the touch sensor layer 100 may be about 2 N/12 mm or more, and the adhesion force of the supporting structure 170 on the flexible circuit board 160 may be about 0.5 N/0.5 mm or more.

The supporting layer 174 of the supporting structure 170 may be bonded to the passivation layer (not illustrated) covering the sensing electrodes 110 and 120 in the touch sensor layer 100. Additionally, the supporting structure 170 may be adhered with the coverlay layer included in the flexible circuit board 160. The supporting layer 174 of the supporting structure 170 and the passivation layer of the touch sensor layer 100 may include substantially the same resin material (e.g., an acrylic resin), and thus the adhesion force may be further increased.

The coverlay layer of the flexible circuit board 160 may include, e.g., polyimide, and thus flexibility may be further improved.

A thickness of the supporting structure 170 may be adjusted within a range capable of satisfying the aforementioned tensile modulus and adhesion force, and may be, e.g., from about 5 to 100 μm.

Figure 2:
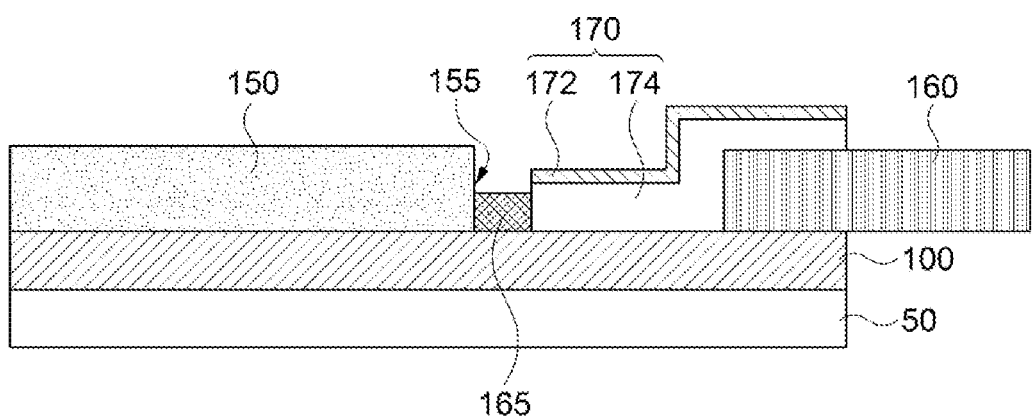
FIG. 2 is a schematic cross-sectional view illustrating a touch sensor module in accordance with exemplary embodiments.

FIG. 2 is a cross-sectional view illustrating a schematic structure of a touch sensor module according to exemplary embodiments. Detailed descriptions of elements/structures substantially the same as or similar to those described with reference to FIG. 1 are omitted herein.

Referring to FIG. 2, the optical layer 150 and the supporting structure 170 may be horizontally spaced apart by a predetermined distance. Accordingly, the gap 155 may be formed between the optical layer 150 and the supporting structure 170. The gap 155 may serve as a margin area for an alignment of the supporting structure 170.

In exemplary embodiments, a filling layer 165 filling the gap 155 may be formed. The filling layer 165 may at least partially fill the gap 155 and may contact a top surface of the touch sensor layer 100 and sidewalls of the optical layer 150 and the supporting structure 170.

In some embodiments, the filling layer 165 may be formed to have a top surface lower than a top surface of each of the optical layer 150 and the touch sensor layer 100.

The filling layer 165 may be formed by filling an adhesive resin composition in the gap 155 and then curing the composition by a room temperature curing process, a thermal curing process or an ultraviolet curing process. The resin composition may include acrylic, silicone, urethane and/or rubber-based resin. In an embodiment, the resin composition may further include a solvent, a photo-polymerizable monomer, a polymerization initiator, a curing agent, or the like.

As described above, during an attaching process of the supporting structure 170, an alignment margin may be first secured through the gap 155 to prevent a contact with the optical layer 150. Thereafter, the filling layer 165 may be formed by filling the resin composition to fill the gap 155. Accordingly, an exposed area of the touch sensor layer 100 may be reduced by the filling layer 165, so that the protection of the sensing electrodes may be effectively implemented. Additionally, the filling layer 165 may contact and hold the sidewalls of the optical layer 150 and the supporting structure 170, so that peeling and lifting of the optical layer 150 and the supporting structure 170 may be suppressed even when the protective film 50 may be peeled off and removed at a high speed. Further, cracks of the sensing electrodes may be remarkably reduced when detaching the protective film 50.

In some embodiments, a viscosity of the filling layer 165 may be from about 1,000 to 5,000 cP at room temperature (25° C.), and preferably from about 1,000 to 4,000 cP. Within the above viscosity range, the filling layer 165 may substantially fill an inside of the gap 155 and an outflow of the resin material may be prevented.

In some embodiments, a tensile modulus of the filling layer 165 may be from about 5 to 3,500 MPa, and preferably from about 1,000 to 3,500 MPa. Within the above tensile modulus range, damages to the sensing electrodes in a bending area of the touch sensor module may be effectively suppressed.

In some embodiments, an adhesion force of the filling layer 165 with respect to a bonding surface of the touch sensor layer 100 may be about 2 N/25 mm or more, and preferably about 5 N/25 mm or more. In this case, when the touch sensor module is bent, delamination of the filling layer 165 and the electrodes of the touch sensor layer 100 may be sufficiently suppressed.

A thickness of the filling layer 165 may be adjusted in a range capable of satisfying the above-described viscosity, tensile modulus and adhesion force, and may be adjusted in a range of, e.g., about 20 to 100 μm.

Figure 3:
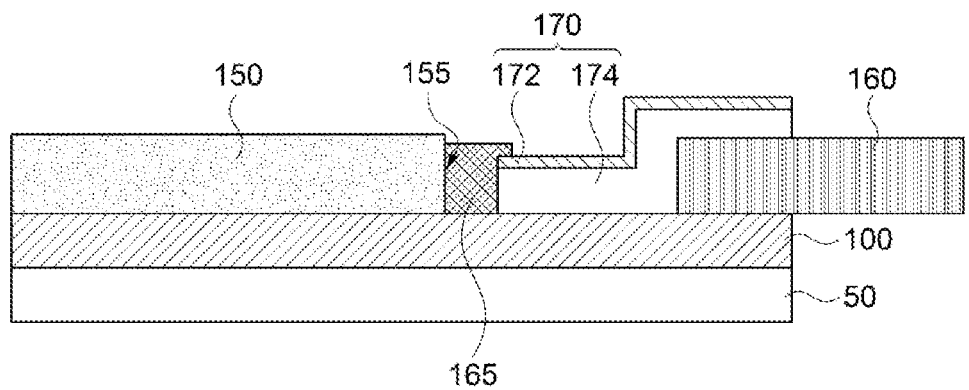
FIG. 3 is a schematic cross-sectional view illustrating a touch sensor module in accordance with exemplary embodiments.

FIG. 3 is a cross-sectional view illustrating a schematic structure of a touch sensor module according to example embodiments. Detailed descriptions of elements/structures substantially the same as or similar to those described with reference to FIGS. 1 and 2 are omitted herein.

Referring to FIG. 3, the filling layer 165 may fill the gap 155 and partially cover the top surface of the supporting structure 170. Accordingly, the supporting structure 170 may be more stably fixed while bending the flexible circuit board 160 and/or detaching the protective film 50.

The top surface of the filling layer 165 may be formed to be lower than the top surface of the optical layer 150. Accordingly, the filling layer 165 may not cover the top surface of the optical layer 150 to prevent properties of the optical layer 150 from being disturbed by the filling layer 165.

Figure 4:
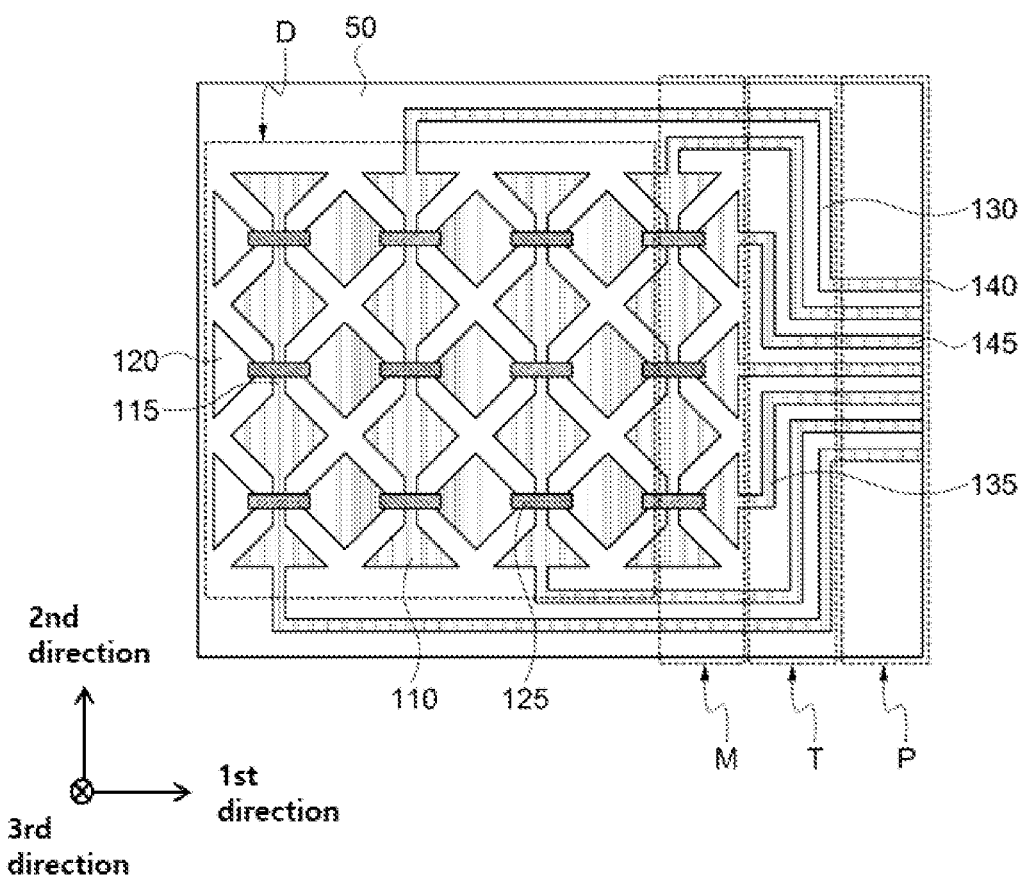
FIGS. 4 and 5 are top planar views illustrating touch sensor layers in accordance with exemplary embodiments.
Figure 5:
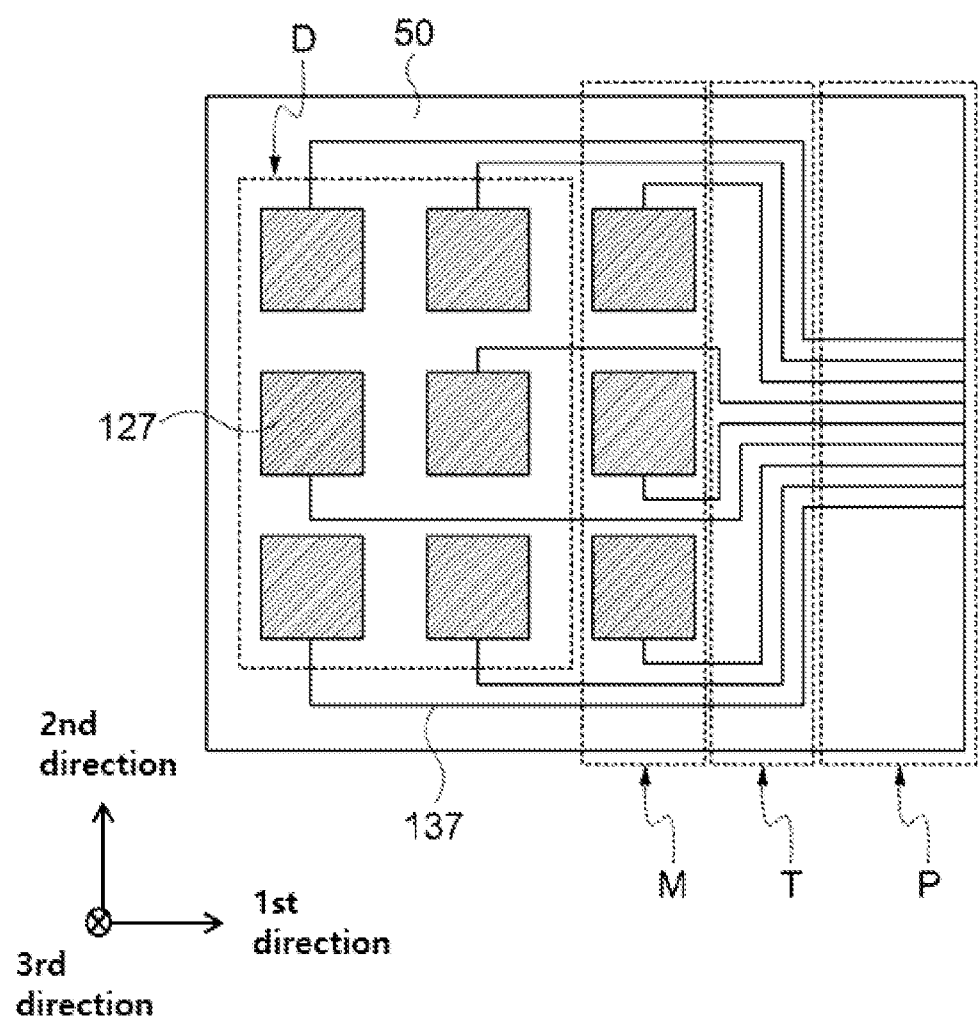

FIGS. 4 and 5 are schematic top planar views illustrating touch sensor layers in accordance with exemplary embodiments.

Referring to FIG. 4, the touch sensor layer 100 may include sensing electrodes 110 and 120, and traces 130 and 135. In exemplary embodiments, the sensing electrodes 110 and 120 may be arranged to be operable by a mutual capacitance-type.

The touch sensor layer may include a display area D, a trace area T and a connection area P. The display area D may include a central area of the touch sensor layer, and may be an area from which an image of an image display device to which the touch sensor module is applied may be displayed to a user.

The connection area P may be disposed at one end portion of the touch sensor layer in the first direction, and may be an area in which an electrical connection with the flexible circuit board 160 may be implemented. As illustrated in FIG. 4, the display area D, the trace area T, and the connection area P may be sequentially disposed along the first direction. In some embodiments, a margin area M may be disposed between the display area D and the trace area T.

The sensing electrodes 110 and 120 may be arranged in the display area D of the touch sensor layer 100. In exemplary embodiments, the sensing electrodes 110 and 120 may include first sensing electrodes 110 and second sensing electrodes 120.

The first sensing electrodes 110 may be arranged, e.g., along the second direction (e.g., a width direction). Accordingly, a first sensing electrode row extending in the second direction may be formed by a plurality of the first sensing electrodes 110. A plurality of the first sensing electrode rows may be arranged along the first direction.

In some embodiments, the first sensing electrodes 110 neighboring in the second direction may be physically or electrically connected to each other by a connecting portion 115. For example, the connecting portion 115 may be integrally formed with the first sensing electrodes 110 at the same level as that of the first sensing electrodes 110.

The second sensing electrodes 120 may be arranged along the first direction (e.g., a length direction). In some embodiments, the second sensing electrodes 120 may each be physically separated into unit electrodes of an island type. In this case, the second sensing electrodes 120 neighboring in the first direction may be electrically connected to each other by a bridge electrode 125.

A plurality of the second sensing electrodes 120 may be connected to each other by the bridge electrodes 125 and may be arranged in the first direction such that a second sensing electrode column extending in the first direction may be formed. Further, a plurality of the second sensing electrode columns may be arranged along the second direction.

The sensing electrodes 110 and 120 and/or the bridge electrode 125 may include a metal, an alloy or a transparent conductive oxide.

For example, the sensing electrodes 110 and 120 and/or the bridge electrode 125 may be formed of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), or an alloy thereof (e.g., a silver-palladium-copper (APC) alloy). These may be used alone or in a combination thereof.

The sensing electrodes 110 and 120 and/or the bridge electrode 125 may include a transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 110 and 120 and/or the bridge electrode 125 may have a multi-layered structure including a transparent conductive oxide layer and a metal layer. For example, the sensing electrodes 110 and 120 and/or the bridge electrode 125 may have a triple-layered structure of a transparent conductive oxide layer-metal layer-transparent conductive oxide layer. In this case, flexible properties may be improved and resistance may be reduced by the metal layer while corrosion resistance and transparency may be improved by the transparent conductive oxide layer.

In some embodiments, the bridge electrode 125 may be formed on an insulation layer (not illustrated). The insulation layer may at least partially cover the connecting portion 115 included in the first sensing electrode 110, and at least partially cover the second sensing electrodes 120 around the connecting portion 115. The bridge electrode 125 may penetrate through the insulation layer and may be electrically connected to the second sensing electrodes 120 adjacent to each other with the connecting portion 115 interposed therebetween.

The insulation layer may include an inorganic insulation material such as a silicon oxide or a silicon nitride, or an organic insulation material such as an acrylic resin or a siloxane resin.

The traces 130 and 135 may include a first trace 130 extending from each of the first sensing electrode rows and a second trace 135 extending from each of the second sensing electrode columns.

As illustrated in FIG. 4, the traces 130 and 135 may extend from a periphery of the display area D and be collected in the trace area T.

For example, the first trace 130 may be branched from each of the first sensing electrode rows from both lateral portions of the touch sensor layer 100 and may extend in the first direction. The first traces 130 may be bent while entering the trace area T to extend in the second direction. The first traces 130 may be bent again in the first direction to extend in the first direction in the connection area P.

In some embodiments, the first traces 130 may be alternately distributed on both lateral portions of the touch sensor layer. The first traces 130 may be evenly distributed on both lateral portions of the touch sensor layer so that stress generated during the bending operation as described below may be uniformly dispersed. Additionally, the first traces 130 may be alternately arranged on both lateral portions so that an alignment margin between the neighboring first traces 130 may be increased.

The second traces 135 may each be branched from each second sensing electrode column and may extend in the second direction in the trace area T. The second traces 135 may be bent again in the first direction to extend in the first direction to the connection area P.

Terminal ends of the traces 130 and 135 may serve as connecting portions that may be collected in the connection area P and electrically connected to the flexible circuit board 160. A first connecting portion 140 and a second connecting potion 145 may be defined by the first trace 130 and the second trace 135, respectively, and may be disposed in the connection area P.

The traces 130 and 135 may include a conductive material substantially the same as or similar to that of the sensing electrodes 110 and 120.

In exemplary embodiments, the flexible circuit board 160 may be electrically connected to the connecting portions 140 and 145 on the connection area P. In some embodiments, a conductive intermediate structure such as an anisotropic conductive film (ACF) may be disposed between the flexible circuit board 160 and the connecting portions 140 and 145.

In exemplary embodiments, the supporting structure 170 may commonly cover the connection area P and the trace area T in a planar view. An adhesion between the flexible circuit board 160 and the touch sensor layer 100 may be enhanced by the supporting structure 170, so that mechanical failures such as detachment or cracks of the flexible circuit board 160 and/or the traces 130 and 135 may be prevented.

In some embodiments, a margin area M may be further included between the display area D and the trace area T. The margin area M may be an area where bending or folding of the touch sensor module may be initiated. Additionally, the margin area M may serve as a buffer area for transmitting a touch signal through the sensing electrodes 120 and 110 between the display area D and the trace area T.

The supporting structure 170 may extend to the margin area M in the planar view. In some embodiments, the supporting structure 170 may entirely cover the margin area M in the planar view. In some embodiments, the supporting structure 170 may partially cover the margin area M so that the gap 155 is formed, as illustrated in FIG. 1. In this case, the supporting structure 170 may also overlap the sensing electrodes 110 and 120 in the planar view. The optical layer 150 illustrated in FIG. 1 may entirely cover the display area D in the planar view.

For example, the filling layer 165 as illustrated in FIGS. 2 and 3 may fill a remaining portion of the margin area M.

The supporting structure 170 may cover some of the sensing electrodes 110 and 120 on the margin area M, so that mechanical defects such as fracture or delamination of the sensing electrodes 110 and 120 may be prevented when folding or bending occurs in the margin area M. Additionally, the filling layer 165 may fill the remaining portion of the margin region M, so that process stability of the sensing electrodes 110 and 120 may be further improved.

Referring to FIG. 5, sensing electrodes 127 and traces 137 of the touch sensor layer may be arranged to be operable in a self-capacitance type.

The touch sensor layer may include the sensing electrodes 127 each of which may be provided in an independent island pattern. Additionally, the traces 137 may be branched from each sensing electrode 127 to extend to the trace area T. Terminal ends of the traces 137 may be collected in the connection area P and may be electrically connected to the flexible circuit board 160.

As described above, the supporting structure 170 may commonly cover the touch sensor layer 100 and the flexible circuit board 160 on the trace area T and the connection area P. Additionally, the supporting structure 170 may extend on the margin area M to cover some of the sensing electrodes 127. In some embodiments, the remaining portion of the margin area M may be filled with the filling layer 135 as described above.

Figure 6:
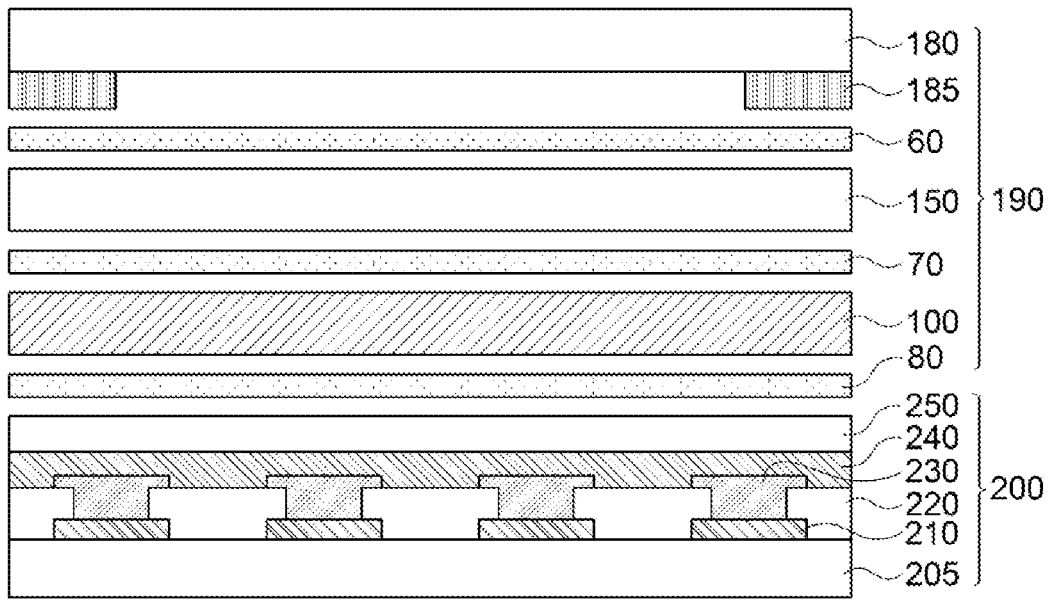
FIG. 6 is a schematic view illustrating a window stack structure and an image display device in accordance with exemplary embodiments.

FIG. 6 is a schematic view illustrating a window stack structure and an image display device in accordance with exemplary embodiments.

A window stack structure 190 may include a window substrate 180 and a touch sensor module according to exemplary embodiments as described above. The touch sensor module may include, e.g., the touch sensor layer 100 as described with reference to FIGS. 4 and 5 and the optical layer 150 stacked on the display area D of the touch sensor layer 100. For convenience of descriptions, illustration of the supporting structure 170 and the flexible circuit board 160 is omitted in FIG. 6 and will be described in more detail with reference to FIG. 7.

The window substrate 180 may include, e.g., a hard coating film. In an embodiment, a light-shielding pattern 185 may be formed on a peripheral portion of one surface of the window substrate 180. The light-shielding pattern 185 may include, e.g., a color-printed pattern, and may have a singlelayered or multi-layered structure. A bezel portion or a non-display area of the image display device may be defined by the light-shielding pattern 185.

The optical layer 150 may include various optical films or optical structures included in the image display device. In some embodiments, the optical layer 150 may include a coating-type polarizer or a polarizing plate. The coating-type polarizer may include a liquid crystal coating layer that may include a cross-linkable liquid crystal compound and a dichroic dye. In this case, the optical layer 150 may include an alignment layer for providing an orientation of the liquid crystal coating layer.

For example, the polarizing plate may include a polyvinyl alcohol-based polarizer and a protective film attached to at least one surface of the polyvinyl alcohol-based polarizer.

The optical layer 150 may be directly attached to the surface of the window substrate 180 or may be attached via a first adhesive layer 60.

The touch sensor layer 100 may be included in the window stack structure 190 as a film or a panel. In an embodiment, the touch sensor layer 100 may be combined with the optical layer 150 via a second adhesive layer 70.

As illustrated in FIG. 6, the window substrate 180, the optical layer 150 and the touch sensor layer 100 may be sequentially positioned from a viewer's side. In this case, sensing electrodes of the touch sensor layer 100 may be disposed under the optical layer 150 including the polarizer or the polarizing plate so that electrode patterns may be effectively prevented from being seen by the viewer.

In an embodiment, the window substrate 180, the touch sensor layer 100 and the optical layer 150 may be sequentially positioned from the viewer's side.

The image display device may include a display panel 200 and the window stack structure 190 disposed on the display panel. The window stack structure 190 may include the touch sensor module according to exemplary embodiments.

The display panel 200 may include a pixel electrode 210, a pixel defining layer 220, a display layer 230, an opposing electrode 240 and an encapsulation layer 250 disposed on a panel substrate 205.

The panel substrate 205 may include a flexible resin material. In this case, the image display device may be a flexible display.

A pixel circuit including a thin film transistor (TFT) may be formed on the panel substrate 205, and insulation layer covering the pixel circuit may be formed. The pixel electrode 210 may be electrically connected to, e.g., a drain electrode of the TFT on the insulation layer.

The pixel defining layer 220 may be formed on the insulation layer, and the pixel electrode 210 may be exposed through the pixel defining layer 220 such that a pixel region may be defined. The display layer 230 may be formed on the pixel electrode 210, and the display layer 230 may include, e.g., a liquid crystal layer or an organic light emitting layer.

The opposing electrode 240 may be disposed on the pixel defining layer 220 and the display layer 230. The opposing electrode 240 may serve as, e.g., a common electrode or a cathode of the image display device. The encapsulation layer 250 may be disposed on the opposing electrode 240 to protect the display panel 200.

In some embodiments, the display panel 200 and the window stack structure may be combined through an adhesive layer 80. For example, a thickness of the adhesive layer 80 may be greater than each thickness of the first and second adhesive layers 60 and 70. A viscoelasticity of the adhesive layer 80 may be about 0.2 MPa or less at a temperature ranging from −20° C. to 80° C. In this case, a noise from the display panel 200 may be blocked, and an interface stress while being bent may be alleviated so that damages of the window stack structure 190 may be avoided. In an embodiment, the viscoelasticity of the adhesive layer 80 may be in a range from about 0.01 MPa to about 0.15 MPa.

Figure 7:
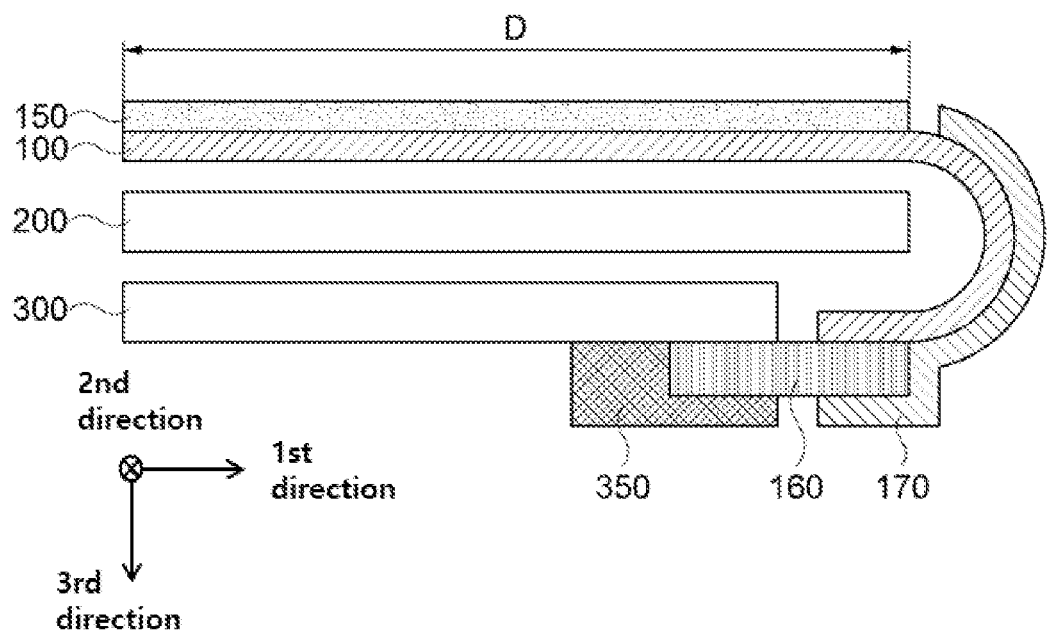
FIGS. 7 and 8 are schematic cross-sectional views illustrating an image display device combined with a touch sensor module in accordance with exemplary embodiments.
Figure 8:
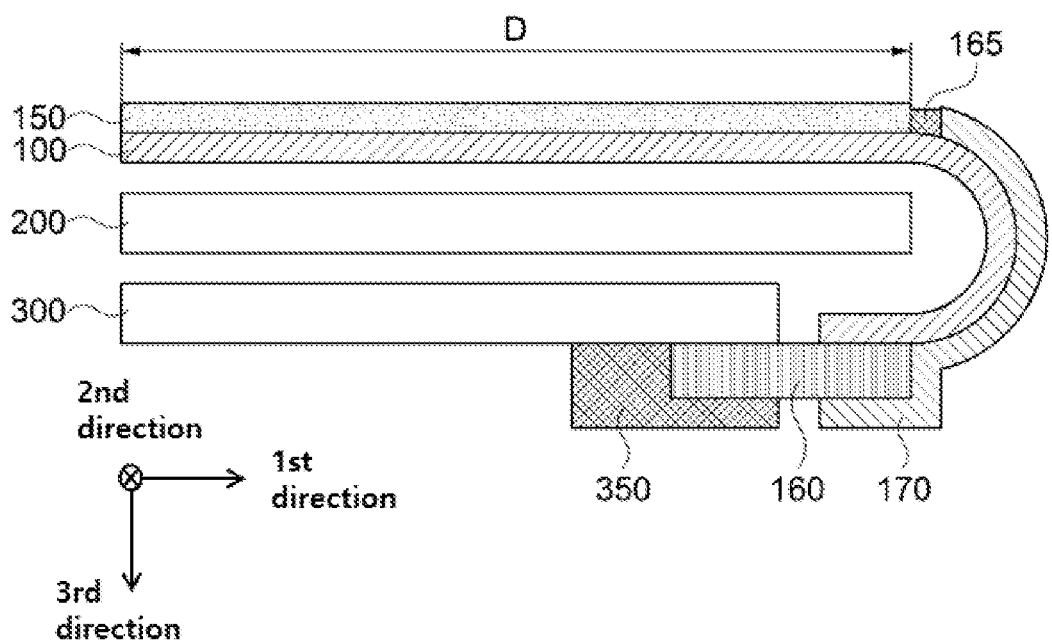

FIGS. 7 and 8 are schematic cross-sectional views illustrating an image display device combined with a touch sensor module in accordance with exemplary embodiments. For example, FIGS. 7 and 8 illustrate a driving circuit connection of a touch sensor module via a flexible circuit board.

Referring to FIG. 7, the image display device may include the display panel 200 and a main board 300, and may include a touch sensor module according to exemplary embodiments as described above. The touch sensor module may include the touch sensor layer 100 and the optical layer 150 disposed on the display area D of the touch sensor layer 100.

As described with reference to FIGS. 4 and 5, bending may be initiated from the margin area M of the touch sensor layer 100 and the bending may occur in the third direction (e.g., a thickness direction of the image display device) along the first direction. Accordingly, the connecting portions of the traces included in the connection area P may be electrically connected to the main board 300 via the flexible circuit board 160. The flexible circuit board 160 may be connected to, e.g., a bonding pad 350 formed on a bottom surface of the main board 300.

In an embodiment, an end portion (e.g., the connection area P and/or the trace area T) of the touch sensor module or the touch sensor layer 100 may be bent by 180 degrees (°) or more. Accordingly, the end portion may extend again in the first direction. The end portion may face a non-bent portion of touch sensor layer 100 in the third direction.

As described above, even though drastic bending is applied, the supporting structure 170 may fix a combination between the flexible circuit board 160 and the touch sensor layer 100, thereby suppressing fracture, separation, etc. of circuits, wiring, electrodes, etc.

Referring to FIG. 8, as described with reference to FIGS. 2 and 3, a filling layer 165 may be formed between the supporting structure 170 and the optical layer 150, so that mechanical stability may be further improved when drastic bending is applied.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

Experimental Example 1: Evaluation of Crack/Touch Sensing According to Formation of a Supporting Structure after Bending Example 1-1

A touch sensor sample (manufactured by Dongwoo Fine-Chem) including electrode patterns and traces that had a thickness of 0.14 μm and were formed of ITO, and a 20 μm PET protective film was prepared.

The traces at a terminal end portion of the touch sensor layer were connected to an FPCB, and a supporting structure was attached to cover the FPCB together at the terminal end portion of the touch sensor layer. A tape (manufactured by Nitto Denko Corporation, product number: 360A) including an acrylic adhesive layer (thickness: 25 μm) as a supporting layer formed on a polyimide (PI) substrate layer (thickness: 53 μm) was used as the supporting structure.

A tensile modulus of the supporting structure was measured as 2,120 MPa. Specifically, the tensile modulus was measured based on a standard of ASTM D638 using AG-X equipment of Shimazdu Corporation.

Adhesion forces of the supporting structure to the touch sensor sample and a surface of the FPCB were measured as 3.1N/12 mm and 0.7N/0.5 mm, respectively.

The adhesion force to the surface of the touch sensor was measured as follows. After attaching an adhesive layer to the surface of the touch sensor and bonding the adhesive layer with soda glass to prepare a surface for measuring the adhesion force. The supporting structure was cut to a width of 12 mm and a length of 100 mm to prepare a specimen, and the supporting structure specimen was attached to the touch sensor surface using a 2 kg roller according to JIS Z 0237 standard, and then compressed in an autoclave (50° C., 5 atms) for about 20 minutes to prepare a measurement sample.

Thereafter, the sample was left for 1 hour at 23° C. and 50 RH % using an autograph (AG-1S, SHIMADZU), and the supporting structure was detached from the surface of the touch sensor at a peel angle of 180° and a peeling speed of 300 mm/min to measure the adhesion force.

The adhesion force to the FPCB surface was determined by a method the same as that for measuring the adhesion force to the touch sensor surface except that an adhesive layer was attached to a lower surface of the FPCB and bonded to soda glass to prepare an FPCB measurement surface, and the supporting structure was cut to a width of 0.5 mm and a length of 100 mm to prepare a specimen.

Example 1-2

A touch sensor module was manufactured by the same method as that in Example 1, except that the thickness of the substrate layer of the supporting structure was formed to be 50 μm and the thickness of the supporting layer of the supporting structure was formed to be 15 μm so that the tensile modulus and the adhesion force were changed.

Example 1-3

A touch sensor module was manufactured by the same method as that in Example 1, except that the thickness of the substrate layer of the supporting structure was formed to be 50 μm using PET, and the thickness of the supporting layer of the supporting structure was formed to be 20 μm so that the tensile modulus and the adhesion force were changed.

Example 1-4

A touch sensor module was manufactured by the same method as that in Example 1, except that the thickness of the substrate layer of the supporting structure was formed to be 25 μm using PET, and the thickness of the supporting layer of the supporting structure was formed to be 40 μm so that the tensile modulus and the adhesion force were changed.

Example 1-5

A touch sensor module was manufactured by the same method as that in Example 1, except that the thickness of the substrate layer of the supporting structure was formed to be 50 μm using PET, and the thickness of the supporting layer of the supporting structure was formed to be 25 μm so that the tensile modulus and the adhesion force were changed.

Example 1-6

A touch sensor module was manufactured by the same method as that in Example 1, except that the thickness of the substrate layer of the supporting structure was formed to be 25 μm using PI, and the thickness of the supporting layer of the supporting structure was formed to be 25 μm using a silicone-based adhesive so that the tensile modulus and the adhesion force were changed.

Example 1-7

A touch sensor module was manufactured by the same method as that in Example 1, except that the thickness of the substrate layer of the supporting structure was formed to be 53 μm using PI, and the thickness of the supporting layer of the supporting structure was formed to be 25 μm using a silicone-based adhesive so that the tensile modulus and the adhesion force were changed.

Example 1-8

A touch sensor module was manufactured by the same method as that in Example 1, except that the thickness of the substrate layer of the supporting structure was formed to be 53 μm using PET, and the thickness of the supporting layer of the supporting structure was formed to be 25 μm using an acrylic adhesive so that the tensile modulus and the adhesion force were changed.

Comparative Example 1

A touch sensor module was manufactured by the same method as that in Example 1, except that the supporting structure was omitted.

The tensile modulus and adhesion values in Examples and Comparative Examples are shown in Table 1 below.

Figure 9:
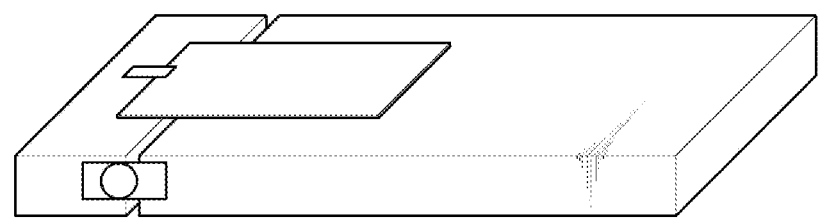
FIG. 9 is a schematic view illustrating a bending test evaluation apparatus/method.
Figure 9:
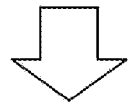
Figure 9:
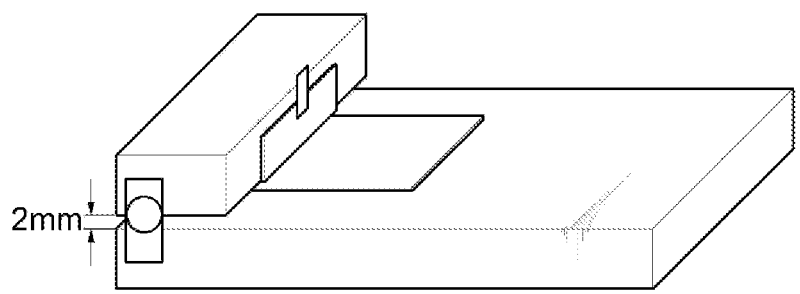

A bending test at room temperature for 500 hr. was performed using a 1R bending evaluation jig for each touch sensor module of the above-described Examples and Comparative Examples as illustrated in FIG. 9.

After the bending test, a delamination of the flexible circuit board (FPCB) and cracks of the traces included in the touch sensor layer were observed, and the results are shown in Table 1 below. In Table 1 below, the result when the delamination and the cracks were not observed is represented as "O", the result when partial delamination and cracks were observed is represented as "Δ", and the result when the delamination/cracks were propagated entirely throughout the FPCB and touch sensor layer is represented as "x".

Further, a touch sensor function was tested after the bending test using a touch sensor function tester. Specifically, in Table I below, the result when the sensing function was maintained is represented as "O", the result when a partial non-sensing region was detected is represented as "Δ", and the result when an entire sensing failure occurred is represented as "x".

TABLE 1

|  | Tensile Modulus (MPa) | Adhesion Force to Touch Sensor Surface (N/12 mm) | Adhesion Force to FPCB Surface (N/0.5 mm) | FPCB Delamination | Trace Cracks | Touch Sensing Function |
|---|---|---|---|---|---|---|
| Example 1-1 | 2120 | 3.1 | 0.7 | ○ | ○ | ○ |
| Example 1-2 | 2137 | 2.7 | 0.6 | ○ | ○ | ○ |
| Example 1-3 | 2801 | 3.1 | 0.8 | ○ | ○ | ○ |
| Example 1-4 | 3313 | 4.9 | 1.2 | ○ | ○ | ○ |
| Example 1-5 | 3058 | 5.2 | 1.5 | ○ | ○ | ○ |
| Example 1-6 | 2501 | 1.5 | 0.2 | Δ | Δ | Δ |
| Example 1-7 | 1401 | 0.9 | 0.1 | Δ | Δ | Δ |
| Example 1-8 | 5100 | 2.0 | 0.5 | Δ | Δ | Δ |
| Comparative Example 1 | — | — | — | x | x | x |

Experimental Example 2: Evaluation of Cracks According to Formation of a Filling Layer Sample 1

A touch sensor sample (manufactured by Dongwoo Fine-Chem) including electrode patterns and traces that had a thickness of 0.14 μm and were formed of ITO, and a 20 μm PET protective film was prepared.

A polarizing plate including a polyvinyl alcohol (PVA) polarizer having a thickness of 20 μm adhered to a 80 μm-thick TAC protective film was attached on a central portion of a touch sensor layer.

The traces at a terminal end portion of the touch sensor layer were connected to an FPCB, and a supporting structure was attached to cover the FPCB together at the terminal end portion of the touch sensor layer and to be separated from the polarizing plate with a spacing distance of 10 μm. A tape (manufactured by Nitto Denko Corporation, product number: 360A) including an acrylic adhesive layer was cut to be used as the supporting structure.

A resin composition was filled in a space between the polarizing plate and the supporting structure, and then cured by ultraviolet rays to form a filling layer. The resin composition was prepared by adding an acrylic copolymer and 1-hydroxycyclohexylphenyl ketone as a photo-polymerization initiator. The acrylic copolymer was prepared by reacting n-butyl acrylate, methacrylate, benzyl methacrylate, acrylic acid and 4-hydroxybutyl acrylate with azobisisobutyronitrile as an initiator in ethyl acetate.

Viscosity, thickness, tensile modulus and adhesion force of the filling layer were each measured, and the results are shown in Table 2 below.

The viscosity of the filling layer was measured at 25° C. using a PP-50 tip using rheometer MCR-300 of Anton Corporation.

The tensile modulus of the filling layer was measured according to a standard of ASTM D638 using AG-X equipment of Shimazdu Corporation.

The adhesion force of the filling layer was measured as follows. A sheet was prepared by applying a filling layer to a thickness of 25 μm on a PET film, attaching a release film thereon, and irradiating a UV lamp (10 mW, 1000 mJ). The prepared sheet was cut to have a width of 25 mm and a length of 100 mm to prepare a filling sheet. Then, the release film attached to the other side of the filling layer was peeled off, and the filling sheet was attached to a surface of the touch sensor using 2 kg roller according to JIS Z 0237 standards, and then pressed in an autoclave (50° C., 5 atms) for about 20 minutes to prepare a sample. Thereafter, the adhesive force when being peeled off at 23° C. and 50 RH % at a peel angle of 180° and a peeling rate of 300 mm/min was measured using an autograph (AG-1S, SHIMADZU).

Samples 2 to 11

A curing amount, an amount of the acrylic copolymer and/or an amount of the photo-polymerization initiator were changed when forming the filling layer to change the viscosity, tensile modulus and adhesion force as shown in Table 2 below.

Sample 12

The touch sensor module was prepared by the same method as that in Example 2-1 except that the filling layer was omitted.

Evaluation of Cracks in the Touch Sensor Layer

In the touch sensor modules of Examples and Comparative Examples, after peeling off the PET protective film attached to a bottom surface of the touch sensor layer, it was detected whether cracks in the electrode pattern or traces included in the touch sensor layer were generated or not.

The occurrence of cracks was observed while changing the peeling rate of the protective film. When no cracks were generated, the result is represented as "O", and the result when cracks were detected is represented as "x".

The evaluation results are shown together in Table 2 below.

TABLE 2

|  | Viscosity (cP) | Tensile Modulus (MPa) | Adhesion Force to Touch Sensor Surface (N/25 mm) | Thickness (μm) | Crack occurrence according to a peeling rate | | |
|---|---|---|---|---|---|---|---|
|  |  |  |  |  | 10 m/min | 20 m/min | 30 m/min |
| Sample 1 | 1500 | 1500 | 6.5 | 50 | ○ | ○ | ○ |
| Sample 2 | 1500 | 1500 | 6.5 | 50 | ○ | ○ | ○ |
| Sample 3 | 1500 | 1500 | 6.5 | 50 | ○ | ○ | ○ |
| Sample 4 | 2200 | 2500 | 5.8 | 50 | ○ | ○ | ○ |
| Sample 5 | 3000 | 1800 | 6.7 | 50 | ○ | ○ | ○ |

TABLE 2-continued

|  | Viscosity (cP) | Tensile Modulus (MPa) | Adhesion Force to Touch Sensor Surface (N/25 mm) | Thickness (μm) | Crack occurrence according to a peeling rate | | |
|---|---|---|---|---|---|---|---|
|  |  |  |  |  | 10 m/min | 20 m/min | 30 m/min |
| Sample 6 | 3600 | 1000 | 7.1 | 50 | ○ | ○ | ○ |
| Sample 7 | 1500 | 1500 | 7.2 | 60 | ○ | ○ | ○ |
| Sample 8 | 1500 | 1500 | 8.1 | 80 | ○ | ○ | ○ |
| Sample 9 | 300 | 3800 | 0.7 | 10 | ○ | x | x |
| Sample 10 | 500 | 1100 | 1.1 | 20 | ○ | x | x |
| Sample 11 | 5500 | 2000 | 7.6 | 150 | ○ | ○ | x |
| Sample 12 | — | — | — | — | x | x | x |

Referring to Table 2, in Sample 12 in which the filling layer was omitted, electrode cracks of the touch sensor layer occurred when the protective film was peeled off. In Samples 9 to 11 where the viscosity of the filling layer was excessively low or high, some electrode cracks were observed as the peeling rate increased.

What is claimed is:

1. A touch sensor module, comprising:
   a touch sensor layer comprising sensing electrodes and traces branching from the sensing electrodes;
   a flexible circuit board electrically connected to the traces at one end portion of the touch sensor layer;
   a supporting structure commonly and partially covering the flexible circuit board and the touch sensor layer; and
   an optical layer disposed on a central portion of the touch sensor layer and spaced apart from the supporting structure in a horizontal direction to form a gap.

2. The touch sensor module according to claim 1, wherein the touch sensor layer comprises a display area in which the sensing electrodes are arranged, a trace area in which the traces are disposed, and a connection area in which terminal ends of the traces are disposed.

3. The touch sensor module according to claim 2, wherein the flexible circuit board is electrically connected to the terminal ends of the traces in the connection area; and
   the supporting structure covers the connection area and the trace area in a planar view.

4. The touch sensor module according to claim 3, wherein the touch sensor layer further comprises a margin area in which some of the sensing electrodes are arranged between the display area and the trace area.

5. The touch sensor module according to claim 4, wherein the supporting structure covers the margin area in the planar view.

6. The touch sensor module according to claim 5, wherein the margin area serves as a bending area.

7. The touch sensor module according to claim 1, wherein the supporting structure comprises a substrate layer; and a supporting layer formed on the substrate layer, wherein the supporting layer comprises an adhesive material.

8. The touch sensor module according to claim 1, wherein a tensile modulus of the supporting structure is in a range from 1,500 to 5,000 MPa.

9. The touch sensor module according to claim 8, wherein an adhesion force of the supporting structure to the touch sensor layer is greater than an adhesion force of the supporting structure to the flexible circuit board.

10. The touch sensor module according to claim 9, wherein the adhesion force of the supporting structure to the touch sensor layer is 2 N/12 mm or more, and the adhesion force of the supporting structure to the flexible circuit board is 0.5 N/0.5 mm or more.

11. The touch sensor module according to claim 1, further comprising:
    a filling layer at least partially filling the gap.

12. The touch sensor module according to claim 11, wherein the filling layer has a top surface lower than top surfaces of the optical layer and the supporting structure.

13. The touch sensor module according to claim 11, wherein the filling layer partially covers a top surface of the supporting structure, and the filling layer has a top surface lower than that of the optical layer.

14. The touch sensor module according to claim 11, wherein a viscosity of the filling layer is in a range from 1,000 to 5,000 cP at room temperature.

15. The touch sensor module according to claim 11, wherein a tensile modulus of the filling layer is in a range from 5 to 3,500 MPa.

16. The touch sensor module according to claim 11, wherein an adhesion force of the filling layer to a surface of the touch sensor layer is 2 N/25 mm or more.

17. The touch sensor module according to claim 11, wherein the optical layer comprises at least one of a polarizer, a polarizing plate, a retardation film, a reflective sheet, a brightness enhancing film or a refractive index matching film.

18. The touch sensor module according to claim 11, wherein the filling layer comprises an adhesive resin.

19. A window stack structure, comprising:
    a window substrate; and
    the touch sensor module according to claim 1 stacked on a surface of the window substrate.

20. An image display device, comprising:
    a display panel; and
    a touch sensor module according to claim 1 stacked on the display panel.

* * * * *